United States Patent [19]
Kitamura

[11] Patent Number: 5,748,553
[45] Date of Patent: May 5, 1998

[54] SEMICONDUCTOR MEMORY DEVICE HAVING EXTENDED MARGIN IN LATCHING INPUT SIGNAL

[75] Inventor: Mamoru Kitamura, Tokyo, Japan

[73] Assignee: NEC Corporation, Japan

[21] Appl. No.: 712,875

[22] Filed: Sep. 12, 1996

[30] Foreign Application Priority Data

Sep. 26, 1995 [JP] Japan .................. 7-273616

[51] Int. Cl.[6] .................. G11C 8/00; G11C 7/00
[52] U.S. Cl. .................. 365/230.03; 365/230.08; 365/233; 365/189.05; 365/194
[58] Field of Search .................. 365/230.03, 230.08, 365/233, 189.05, 194

[56] References Cited

U.S. PATENT DOCUMENTS 5,566,108  10/1996  Kitamura .................. 365/233
5,581,512  12/1996  Kitamura .................. 365/233

Primary Examiner—David C. Nelms
Assistant Examiner—Trong Phan

[57] ABSTRACT

A semiconductor memory device includes an internal clock signal generating section for generating an internal clock signal from an external clock signal. A latch section includes an address latching circuit for latching an inputted address, a command latching circuit for latching an inputted command and a write data latching circuit for latching an inputted write data. A state setting section controls the address latching circuit, the command latching circuit and the write data latching circuit based on an address key latched by the address latching circuit and a mode setting command latched by the command latching circuit such that a time difference is selectively extended between a first timing of the internal clock signal and a second timing for each of the address, the command and the write data to be changed.

17 Claims, 8 Drawing Sheets

SEMICONDUCTOR MEMORY DEVICE HAVING EXTENDED MARGIN IN LATCHING INPUT SIGNAL

BACKGROUND OF THE INVENTION

1. Field of the Invention

The present invention relates to a semiconductor memory device, and more particularly to a semiconductor memory device in which a time margin can be extended in latching an input signal.

2. Description of Related Art

As a conventional semiconductor memory device which uses input latch circuits, there is well known a clock synchronous type dynamic random access memory (to be referred to as a "synchronous type DRAM" hereinafter) which operates in synchronous with an external clock signal. In such a synchronous type DRAM, there are various types of technique to realize a high speed operation. As one of such various types of speeding-up technique, 3-stage pipelining technique is known. This is the technique in which the operations from an inputting operation of a column address (a column address) to a read/write operation are divided into three stages using two latch circuits to execute the operation at the respective stages in parallel so that the high speed operation of the synchronous DRAM is realized.

FIG. 1 is a block diagram illustrating the structure of a conventional synchronous type DRAM. Referring to FIG. 1, this conventional synchronous type DRAM is composed of an address input circuit 101, a command input circuit 121 (a command includes a row address selection command, a read/write command, a precharge command and so on), a clock input circuit 134, a data output circuit 120, a data input circuit 132, an internal clock signal generating circuit (ICLK) 135, a state setting circuit (SS) 133, internal latch circuits 105 and 119, input latch circuits 102, 122, and 131, a column address buffer (CAB) 103, a column decoder (CDEC) 104, a row address buffer (RAB) 107, a row decoder (RDEC) 108, a memory cell array 110, a column address control circuit (CA CTRL) 111, a row address control circuit (RA CTRL) 113, a sense amplifier (SA) 116, a data amplifier (DA) 118, a write control circuit (WCTRL) 126, a read control circuit (RCTRL) 127, logic circuits 137 and 143, and a delay circuit (D) 139.

FIGS. 2A through 2D are timing charts for explaining an input set-up time and an input hold time, and FIG. 3 is a circuit diagram illustrating the structure of each of the latch circuits 102, 122 and 131. Referring to FIGS. 2A through 2D and 3, the above-mentioned input set-up time and input hold time will be described in detail.

The input set-up time is defined as the time period shown by ① in FIG. 2D from a time when the input signal of a command, an address, or a data is switched to a time when the external clock signal rises up. The input hold time is defined as the time period shown by ② in FIG. 2D from a time when the external clock signal rises up to a time when the input signal is switched next. As seen from an example of the input latch circuit shown in FIG. 3, the input signal is supplied to the data input terminal of a latch 156 such that it is latched at a predetermined timing from the internal clock signal (1) which is generated from the external clock signal by the circuit 135. That is, the input set-up time and input hold time define margins of the latch operation. Unless the predetermined timing is not kept, a latch error, occurs, i.e., an erroneous latch operation is executed. For instance, in a case that an address of "A" is to be latched, if the address of "A" is not inputted at a timing within the input set-up time, an address of "B" is latched, as shown in FIG. 2C. Also, if the address input is not performed at the timing within the input hold time, an address of "C" is latched. This is similarly applied to a command input operation and a write data input operation shown in FIGS. 2B and 2D.

A combination of the input set-up time and the input hold time is referred to as an input window width, as shown by ③ in FIG. 2D. The input window width has to be narrowed as the frequency of the external clock signal is increased if the continuous input is to be considered. The input window width is normally set to a value in range of 3 to 4 ns in 100 MHz (one cycle is 10 ns) operation synchronous type DRAM.

However, there is the following problems in the above-mentioned conventional synchronous DRAM. That is, in the system using the synchronous type DRAM, only one of the input set-up time and the input hold time is generally considered as more significant. The input is usually switched once for every clock cycle. For instance, in a case that the input set-up time is considered as more significant, the input signal is switched once at least before the set-up time from the rising edge of the clock signal. Also, in a case that the input hold time is considered as more significant, the input signal is switched once at least after the input hold time from the rising edge of the clock signal. However, in a case that the synchronous type DRAM is designed, actually, both of the input set-up time and the input hold time are designed to be optimal such that it is made possible to cope with both of the system in which the input set-up time is considered as more important and the system in which the input hold time is considered as more important.

Also, main items, based on which the product grade of the synchronous type DRAM is determined a cycle time, i.e., the operation frequency, an access time, and the input window width, i.e., the combination of the input set-up time and the input hold time. The input set-up time and the input hold time have the characteristic much influenced by variation of process parameters in addition to the power supply dependency and the temperature dependency. This is because the characteristics of the input circuit 101, 122, or 131 change depending upon the power supply level and temperature, and the process parameters. For instance, there is caused the difference in the response speed of the above-mentioned input circuit between the transition from a Low level to a High level and the transition from the High level to the Low level, or there is caused a deviation between the timing of the input signal to the latch circuit and the timing of the internal clock signal.

More particularly, if the changes in the manufacturing process and so on are taken into account, the input window width has a limit of about 3 ns. In a future product having the clock signal frequency of 100 MHz or above, it would be very difficult to design the optimum input set-up time and input hold time at the same time. For instance, the input window width must be about 2 ns in the synchronous type DRAM having the clock signal frequency of 200 MHz corresponding to a cycle of 5 ns.

Therefore, in such a synchronous type DRAM having a high clock signal frequency, even if the synchronous type DRAM has sufficient ability on the cycle time and the access time, there is a possibility that the product grade is determined based on the input set-up time and the input hold time. That is, the input set-up time and the input hold time would become a determinant against the increase of the operation frequency in the synchronous type DRAM having the high clock signal frequency.

SUMMARY OF THE INVENTION

The present invention is made in the light of the above-mentioned problems, and has as an object to provide a semiconductor memory device in which the state of an input latch circuit is switched by a state setting circuit so that the problem can be eliminated that the product grade is determined based on the input set-up time and input hold time.

In order to achieve an aspect of the present invention, a semiconductor memory device includes an internal clock signal generating section for generating an internal clock signal from an external clock signal, a latch section including an address latching circuit for latching an inputted address, a command latching circuit for latching an inputted command and a write data latching circuit for latching an inputted write data, and a state setting section for controlling the address latching circuit, the command latching circuit and the write data latching circuit based on an address key latched by the address latching circuit and a mode setting command latched by the command latching circuit such that a time difference is selectively extended between a first timing of the internal clock signal and a second timing for each of the address, the command and the write data to be changed.

In this case, the state setting section selectively extends the time difference using at least one bit of the address key, and the state setting section may include at least one flip-flop corresponding to the at least one bit of the address key and generate a mode signal from the at least one bit of the address key in response to the mode setting command to control the address latching circuit, the command latching circuit and the write data latching circuit.

In a case where the extended time difference is associated with an input hold time and an input set-up time is prefixed, the state setting section generates a mode signal from the address key and the mode setting command to set an input hold time mode, an input set-up time mode being normally set when the input hold time mode is not set. Each of the address latching circuit, the command latching circuit and the write data latching circuit includes a latching section for latching a latch input in response to the internal clock signal, and a delaying section for normally passing a corresponding one of the address, the command and the write data to the latching section as the latch input in the input set-up time mode and for delaying the corresponding one to supply the delayed corresponding one to the latching section as the latch input in the input hold time mode.

In a case where the extended time difference is associated with an input set-up time and an input hold time is prefixed, the state setting section generates a mode signal from the address key and the mode setting command to set an input set-up time mode, an input hold time mode being normally set when the input set-up time mode is not set. Each of the address latching circuit, the command latching circuit and the write data latching circuit includes a latching section for latching a corresponding one of the address, the command and the write data in response to a latch clock signal, and a delaying section for normally passing the internal clock signal to the latching section as the latch clock signal in the input hold time mode and for delaying the internal clock signal to supply the delayed internal clock signal to the latching section as the latch clock signal in the input set-up time mode.

In a case where the extended time difference is associated with an input set-up time and an input hold time, the state setting section generates a mode signal from the address key and the mode setting command to set an input setup time mode when the mode signal is non-active and set to an input hold time mode when the mode signal is active. Each of the address latching circuit, the command latching circuit and the write data latching circuit includes a latching section for latching a latch input in response to a latch clock signal, and a delaying section for passing the internal clock signal to the latching section as the latch clock signal in the input hold time mode and delaying a corresponding one of the address, the command and the write data to supply the delayed corresponding one to the latching section as the latch input in the input hold time mode, and for normally passing the corresponding one to the latching section as the latch input in the input set-up time mode and delaying the internal clock signal to supply the delayed internal clock signal to the latching section as the latch clock signal in the input set-up time mode.

In order to achieve another aspect of the present invention, a method of providing a semiconductor memory device in which a user can select one of use of an input set-up time and use of an input hold time, includes the steps of:

generating an internal clock signal from an external clock signal;

setting an input set-up time mode and an input hold time mode in accordance with the user selection;

elongating a time difference between a first timing of the internal clock signal and a second timing for each of an address, an command and an write data to be changed, in accordance with the mode set based on the address key and the command; and latching the address, the command, and the write data in response to the internal clock signal using the elongated time difference for access to a memory cell array of the semiconductor memory device.

DESCRIPTION OF THE PREFERRED EMBODIMENTS

A semiconductor memory device such as a synchronous type dynamic random access memory (DRAM) of the present invention will be described below with reference to the accompanying drawings.

Figure 1:
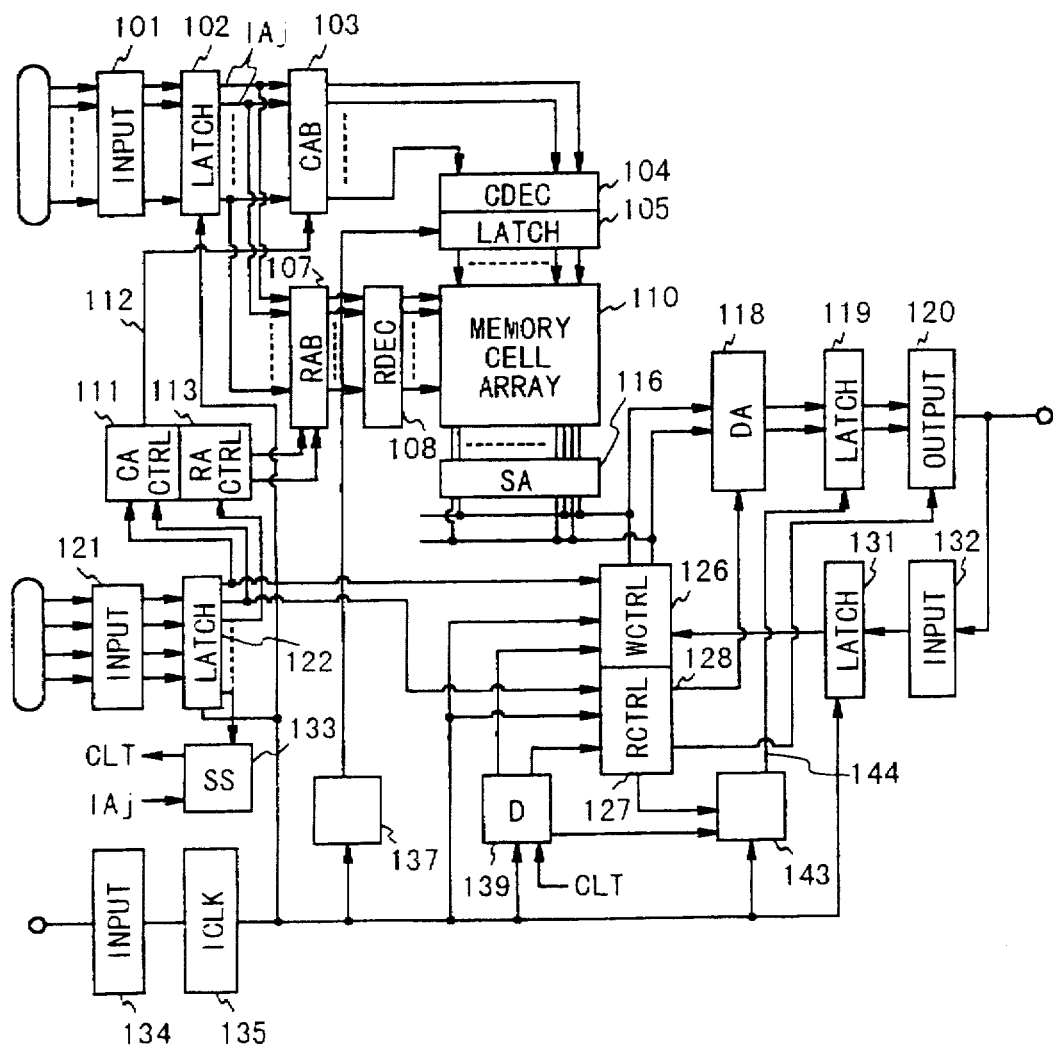
FIG. 1 is a block diagram illustrating the structure of a conventional synchronous type dynamic random access memory (DRAM)
Figure 2:
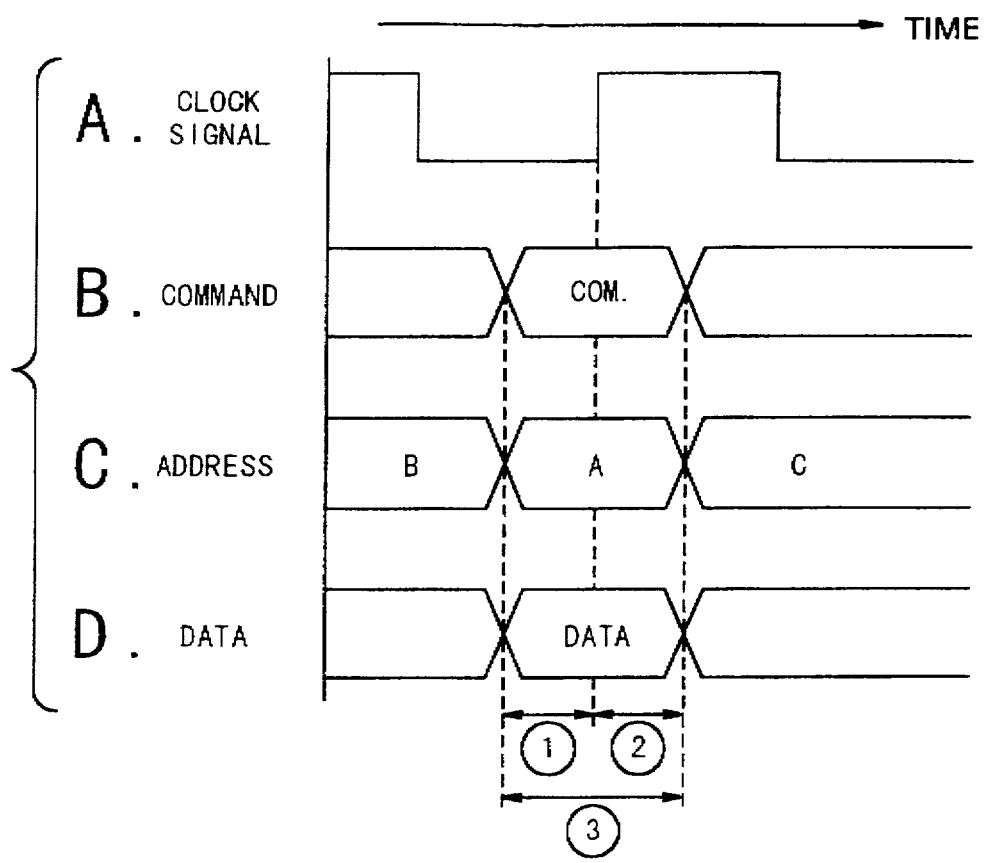
FIGS. 2A to 2D are diagrams for explaining an input set-up time ①, an input hold time ②, and an input window width ③ in the conventional synchronous type DRAM shown in FIG. 1.
Figure 3:
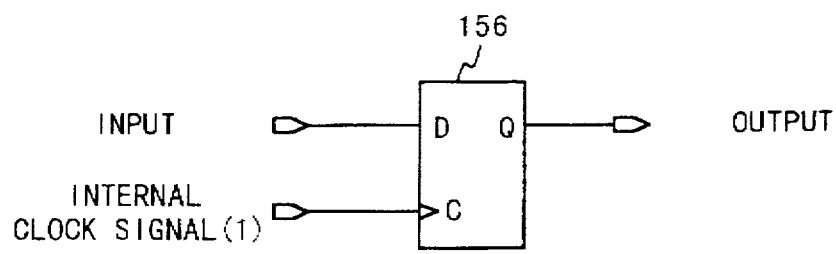
FIG. 3 is a circuit diagram for explaining the structure of each of the latch circuits in the conventional synchronous type DRAM shown in FIG. 1.
Figure 4:
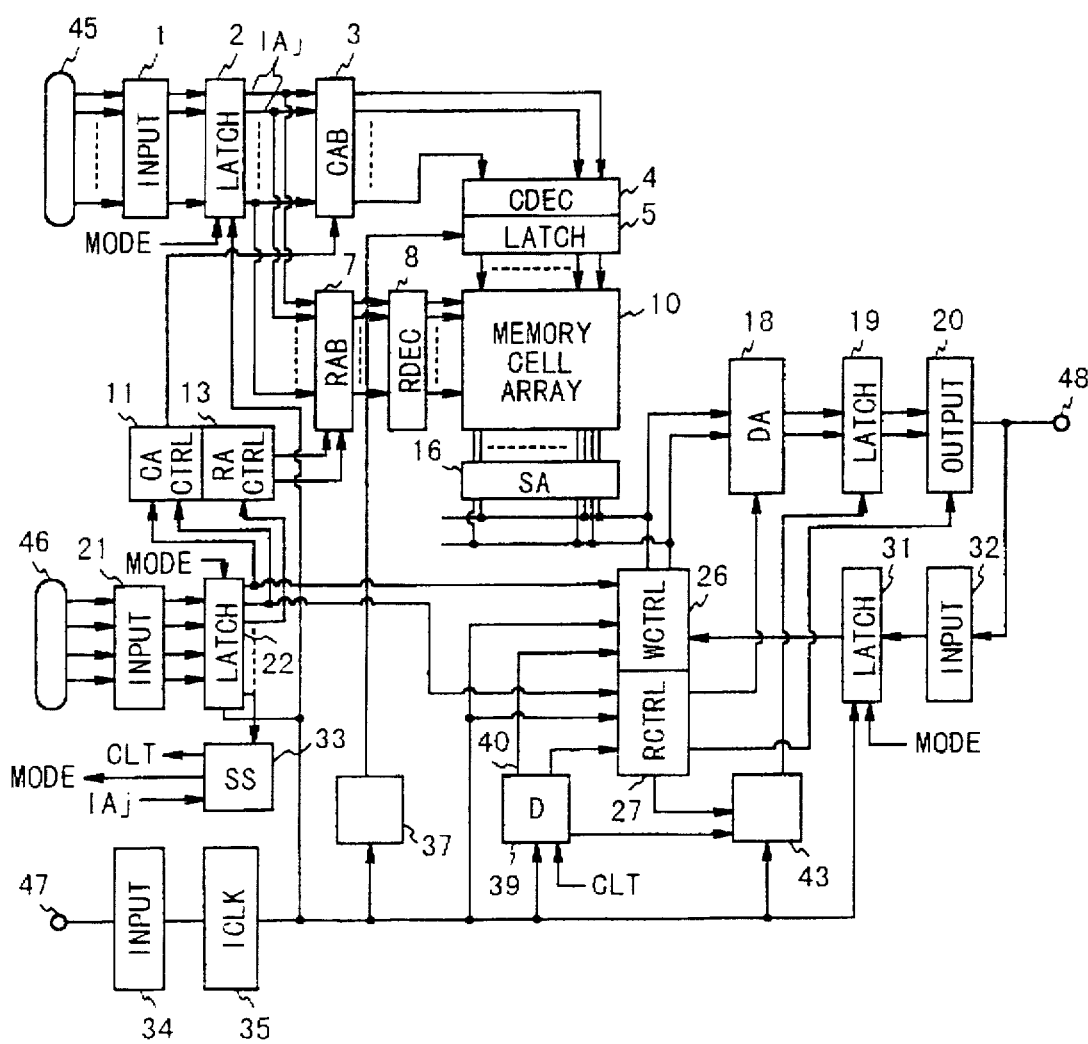
FIG. 4 is a block diagram illustrating the structure of semiconductor memory device such as a synchronous type DRAM according to an embodiment of the present invention.

FIG. 4 is a block diagram illustrating the structure of the synchronous type DRAM according to an embodiment of the present invention. In FIG. 4, the synchronous type DRAM is composed of an address input circuit 1, a command input circuit 21, a clock input circuit 34, a data output circuit 20, a data input circuit 32, an internal clock signal generating circuit (ICLK) 35, a state setting circuit (SS) 33, latch circuits 2, 5, 19, 22, and 31, a column address buffer (CAB) 3, a column decoder (CDEC) 4, a row address buffer (RAB) 7, a row decoder (RDEC) 8, a memory cell array 10, a column address control circuit (CA CTRL) 11, a row address control circuit (RA CTRL) 13, a sense amplifier (SA) 16, a data amplifier (DA) 18, a write control circuit (WCTRL) 26, a read control circuit (RCTRL) 27, logic circuits 37 and 43, a delay circuit (D) 39, an address input terminal 45, a command input terminal 46, a data input/output terminal 48, and an external clock input terminal 47.

Figure 7:
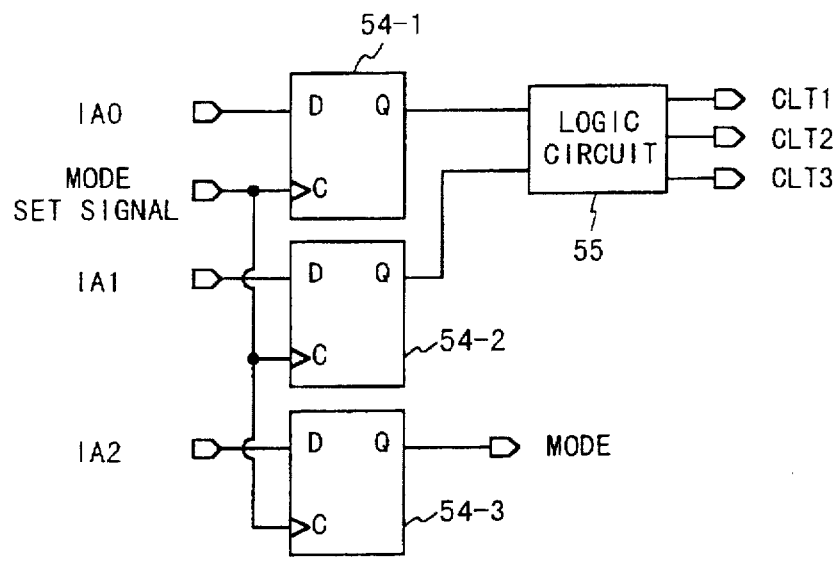
FIG. 7 is a circuit diagram illustrating an example of the structure of the state setting circuit in the synchronous type DRAM according to the embodiment of the present invention shown in FIG. 4.

FIG. 7 is a circuit diagram illustrating an example of the structure of the state setting (SS) circuit 33. Referring to FIG. 7, the state setting circuit 33 is composed of D-type flip-flop circuits 54-1, 54-2, and 54-3 and a logic circuit 55. Three lower bits IA0, IA1 and IA2 of an address key which is inputted to the address input circuit 1 through the address input terminal 45 are supplied to the D terminals of the D-type flip-flops 54-1, 54-2 and 54-3, respectively. A signal MODE SET, which is outputted from the latch circuit 22 when a mode set command is inputted to the input circuit 21 through the command input terminal 46, is supplied to the clock terminals of the D-type flip-flops 54-1, 54-2 and 54-3, respectively. The logic circuit 55 generates control signal CLT1, CLT2 and CLT3 from the outputs of the D-type flip-flops 54-1 and 54-2. The signal MODE is outputted from the Q terminal of the D-type flip-flop 54-3. The signal MODE is supplied to the address latch circuit 2, the command latch circuit 22 and the write data latch circuit 31. That is, these latch circuits are controlled by the MODE signal. Note that FIG. 7 shows only an example in which the address signals A0–A2 are used. The state setting circuit 33 is not restricted to the circuit shown in FIG. 7.

Figure 5:
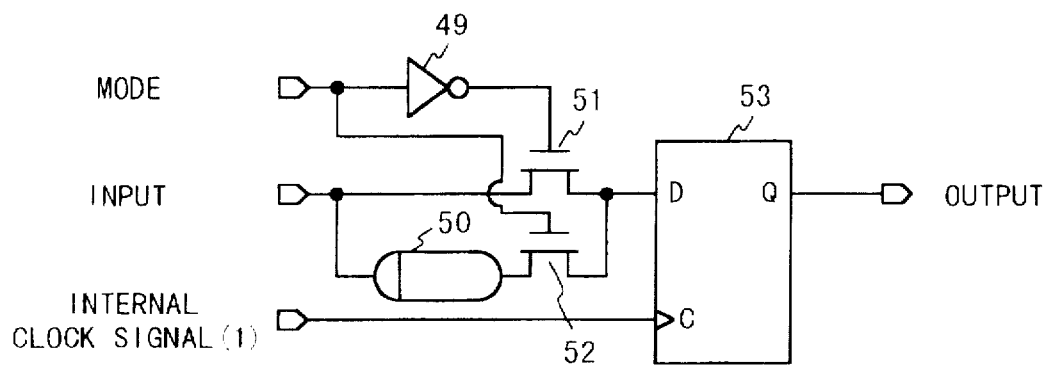
FIG. 5 is a circuit diagram illustrating an example of the structure of each of latch circuits 2, 22 and 31 in the synchronous type DRAM according to the embodiment of the present invention shown in FIG. 4.

FIG. 5 is a circuit diagrams illustrating an example of the structure of each of the latch circuits 2, 22 and 31. In this circuit structure, the input set-up time is prefixed to ensure a latching operation margin sufficient to allow an input signal to be reliably latched. As a result, the input hold time is made shorter. Therefore, when the input hold time is used, the latching operation margin of the input hold time is extended.

Referring to FIG. 5, each of these latch circuits is composed of an inverter 49, a delay circuit 50, N-channel MOS transistors 51 and 52 which each act as a transfer gate or pass transistor, and a D-type flip-flop 53. The signal MODE is supplied to the gate of the N-channel MOS transistor 51 via the inverter 49 and to the gate of the N-channel MOS transistor 52 directly. An input signal is supplied to the data terminal of the D-type flip-flop 53 via the N-channel MOS transistor 51 in one path and the N-channel MOS transistor 52 and the delay circuit 50 in the other path such that the D-type flip-flop 53 outputs an output from the Q terminal. The internal clock signal (1) is directly supplied to the clock terminal of the D-type flip-flop 53.

The latch circuit shown in FIG. 5 is constituted in such a manner that one of the input signal and a signal obtained by delaying the input signal by the delay circuit 50 is selected and inputted to the data terminal of the D-type flip-flop circuit 53 in accordance with the signal MODE set by the state setting circuit 33. The internal clock signal (1) which is generated from the external clock signal by the internal clock signal generating circuit 35 is supplied to the clock terminal of the D-type flip-flop 53. That is, when the MODE signal is the Low level, the N-type MOS transistor 51 is set to a conductive state by the inverter 49 and the N-type MOS transistor 52 is set to a non-conductive state. As a result, the input signal is latched as it is, by the D-type flip-flop circuit 53 in response to the internal clock signal (1). On the other hand, when the MODE signal is in the High level, the N-type MOS transistor 52 is set to the conductive state and the N-type MOS transistor 51 is set to the non-conductive state. As a result, the signal obtained by delaying the input signal by the delay circuit 50 is latched by the D-type flip-flop circuit 53 in response to the internal clock signal (1). That is, the input hold time is extended a time interval corresponding to the delay time of the delay circuit 50.

Figure 6:
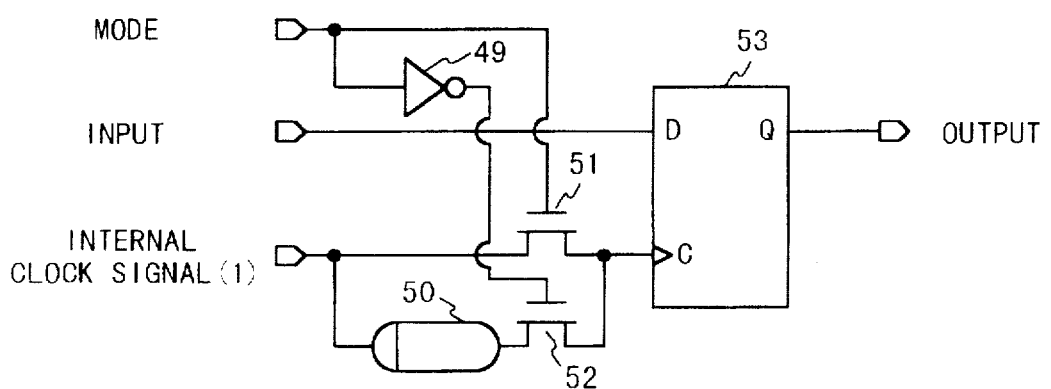
FIG. 6 is a circuit diagram illustrating another example of the structure of the latch circuits 2, 22 and 31 in the synchronous type DRAM according to the embodiment of the present invention shown in FIG. 4.

FIG. 6 is a circuit diagrams illustrating another example of the structure of each of the latch circuits 2, 22 and 31. In this circuit structure, the input hold time is prefixed to ensure a latching operation margin sufficient to allow an input signal to be reliably latched. As a result, the input set-up time is made shorter. Therefore, when the input set-up time is used, the latching operation margin of the input set-up time is extended.

Referring to FIG. 6, each of these latch circuits is composed of an inverter 49, a delay circuit 50, N-channel MOS transistors 51 and 52 which each act as a transfer gate or pass transistor, and a D-type flip-flop 53. The signal MODE is supplied to the gate of the N-channel MOS transistor 52 via the inverter 49 and to the gate of the N-channel MOS transistor 51 directly. The input signal is directly supplied to the data terminal of the D-type flip-flop 53. The internal clock signal (1) is supplied to the clock terminal of the D-type flip-flop 53 via the N-channel MOS transistor 51 in one path and via the N-channel MOS transistor 52 and the delay circuit 50 in the other path such that the D-type flip-flop 53 latches the input signal in response to the internal clock signal (1) or the delayed internal clock signal (1).

The latch circuit shown in FIG. 6 is constituted in such a manner that one of the internal clock signal (1) and a clock signal obtained by delaying the internal clock signal (1) by the delay circuit 50 is selected and inputted to the clock terminal of the D-type flip-flop circuit 53 in accordance with the MODE signal set by the state setting circuit 33. The input signal is directly supplied to the data terminal of the D-type flip-flop 53. That is, when the MODE signal is the Low level, the N-type MOS transistor 52 is set to a conductive state by the inverter 49 and the N-type MOS transistor 51 is set to a non-conductive state. As a result, the input signal is latched as it is, by the D-type flip-flop circuit 53 in response to the clock signal obtained by delaying the internal clock signal (1) by the delay circuit 50. That is, the input set-up time is extended a time interval corresponding to the delay time of the delay circuit 50. On the other hand, when the MODE signal is in the High level, the N-type MOS transistor 51 is set to the conductive state and the N-type MOS transistor 52 is set to the non-conductive state. As a result, the input signal is latched by the D-type flip-flop circuit 53 in response to the internal clock signal (1).

Figure 11:
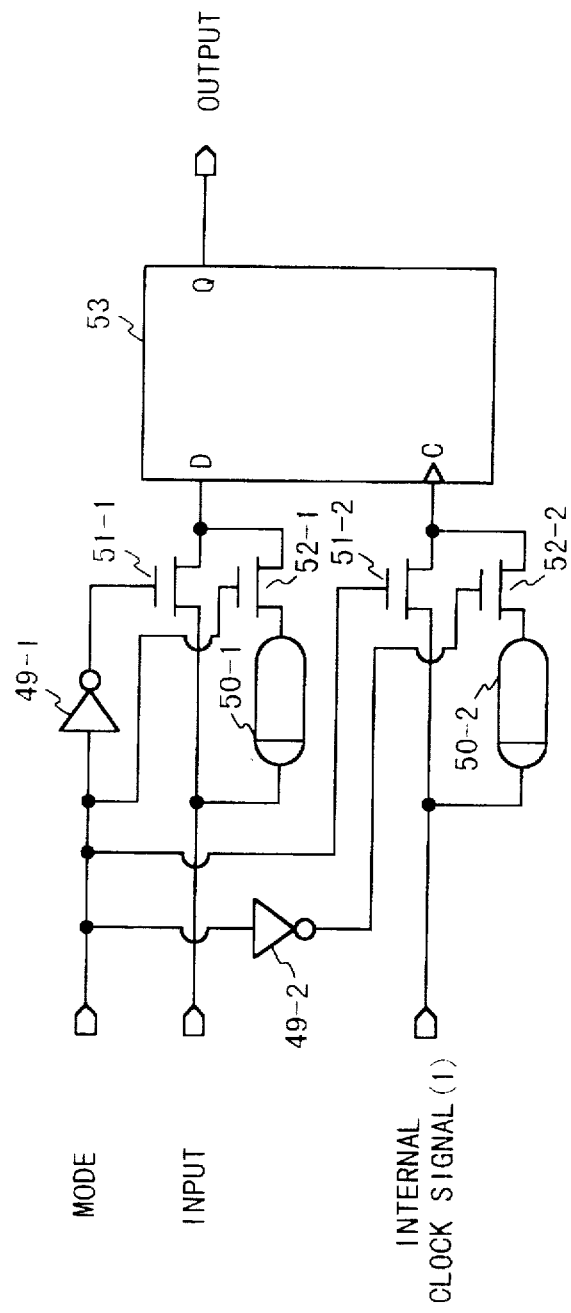
FIG. 11 is a circuit diagram illustrating still another example of the structure of the latch circuits 2, 22 and 31 obtained by combining the circuits of FIGS. 5 and 6 in the synchronous type DRAM according to the embodiment of the present invention shown in FIG. 4.

If the circuit of FIG. 5 and the circuit of FIG. 6 are combined as shown in FIG. 11, a normal rising edge of the internal clock signal (1) is located at substantially middle point of the input window width and the input set-up time and the input hold time are extended in accordance with the MODE signal. That is, when the MODE signal is in the Low level, the input set-up time is extended and when the MODE signal is in the High level, the input hold time is extended.

Next, the operation of the synchronous type DRAM of the present embodiment will be explained with reference to FIGS. 8A to 8F.

Figure 8:
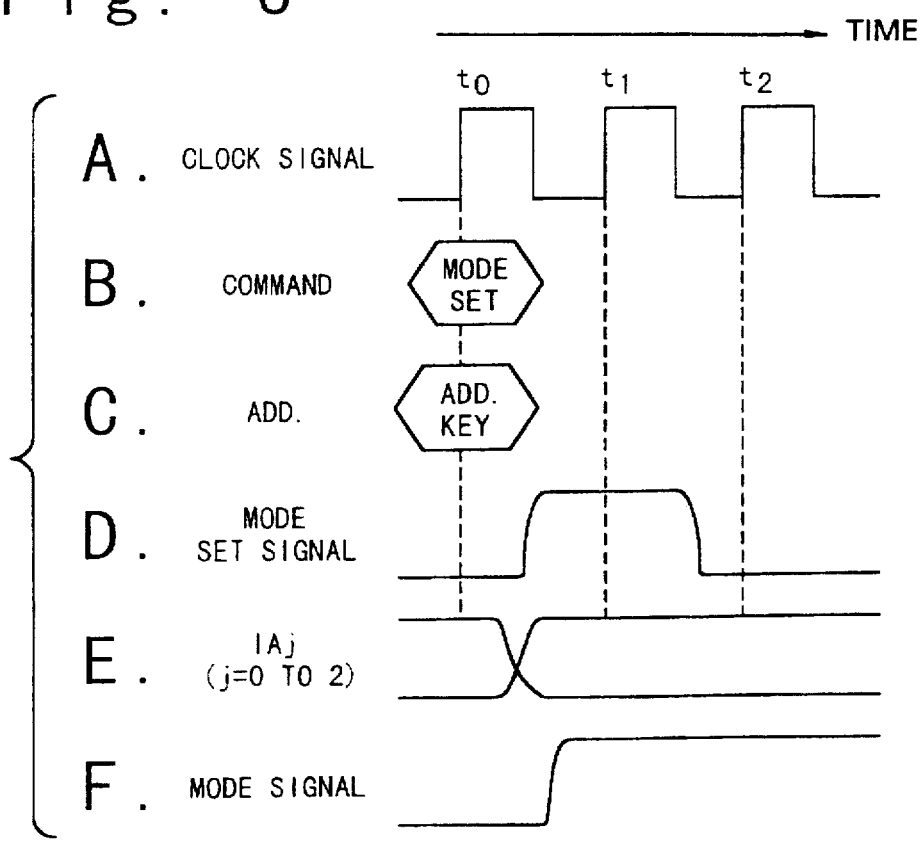
FIGS. 8A to 8F are diagrams illustrating the signal wave forms when a state setting command is set in the embodiment of the present invention shown in FIG. 4.

At a time t0, a MODE SET command as a state setting command is inputted from the command input terminal 46 to the command input circuit 21 and decoded therein and latched by the latch circuit 22, as shown in FIG. 8B. The MODE SET command includes a chip select (CS) bar signal which is low active, a row address strobe (RAS) bar signal which is low active, a column address strobe (CAS) bar signal which is low active, and a write enable (WE) bar signal which is low active. The signals "CS bar", "RAS bar", "CAS bar" and "WE bar" are respectively referred to as "CSB", "RASB", "CASB" and "WEB", hereinafter. In this case, the signals CSB, RASB, CASB and WEB are all in the Low level. The command signal MODE SET is set to the High level at a time t1 as shown in FIG. 8D. The command signal MODE SET is supplied from the latch circuit 22 to the clock terminals of the D-type flip-flops 54-1, 54-2 and 54-3 in the state setting circuit 33. Also, an address key is inputted from the address input terminal 45 to the address input circuit 1 at the time t0, and latched by the latch circuit 2, as shown in FIG. 8C. Three lower bits IA0, IA1 and IA2 of the latched address as internal address signal are supplied to the data terminals of the D-type flip-flops 54-1, 54-2 and 54-3 and latched in response to the command signal MODE SET at the time t1, so that the signal MODE of the High level is outputted from the D-type flip-flop 54-3, as shown in FIG. 8F. The signal MODE is supplied to the address latch circuits 2, the command latch circuit 22 and the data latch circuit 31. Similarly, logic control signals CLT1 to CLT3 which define CAS latency are outputted from the logic circuit 55 through the D-type flip-flops 54-1 and 54-2 in response to the command signal MODE SET based on the internal address bit signals IA0 and IA1. The control signals CLT1 to CLT3 are supplied to the delay circuit 39.

Next, the activating operation will be described including -the input set-up time and the input hold time with reference -to FIGS. 9A to 9I. In this example, the latch circuit shown in FIG. 5 is used and the signal MODE is in the High level. Therefore, the description is made on the input hold time. However, the description is the same as in the input set-up time.

Figure 9:
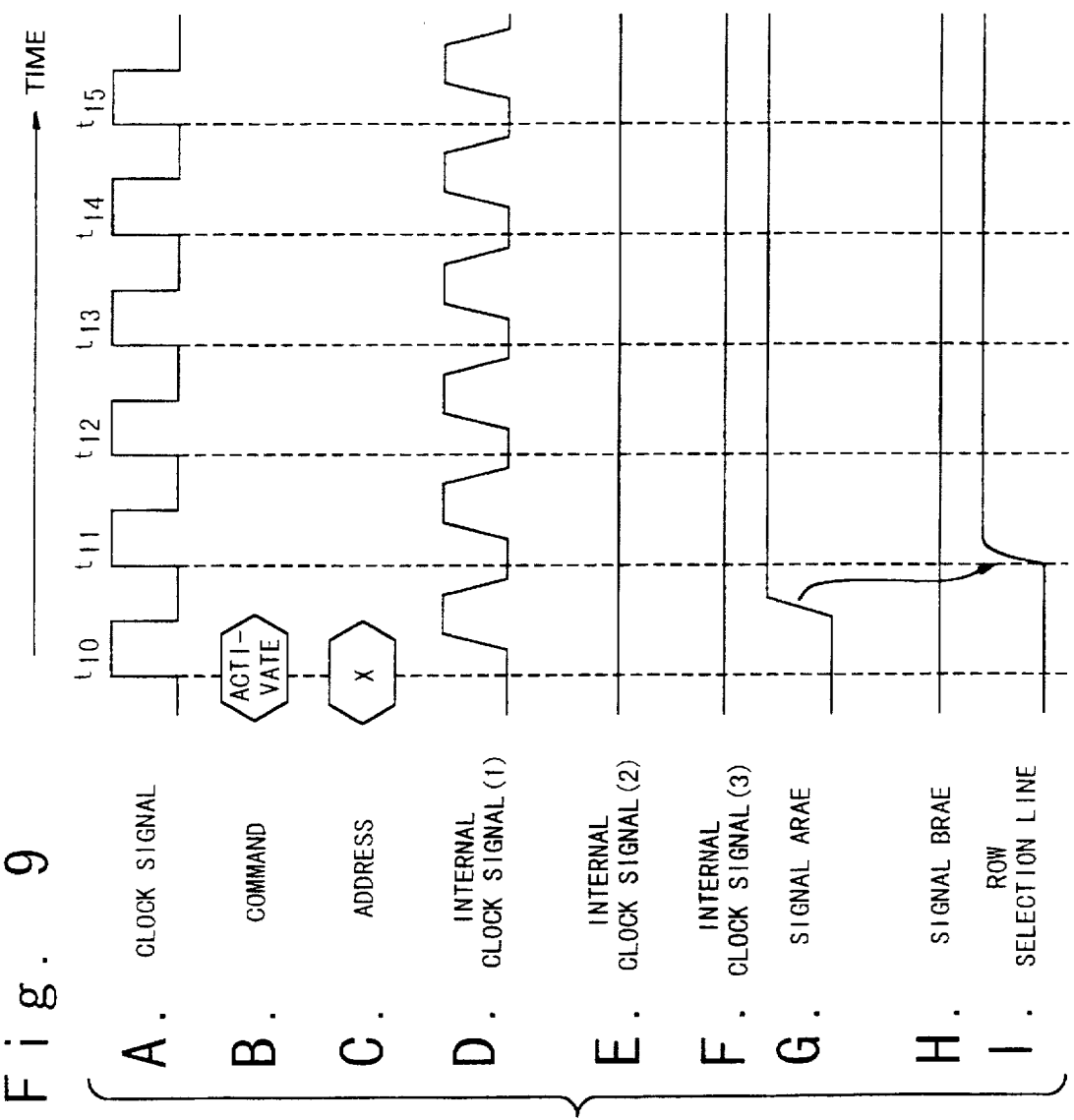
FIGS. 9A to 9I are timing charts illustrating the signal wave forms of respective signals when an activating command signal is inputted to the synchronous type DRAM of the present invention shown in FIG. 4.

An activating command signal is inputted to a terminal 46 at a time t10 as shown in FIG. 9B. The activating command signal, i.e., a column address group operation command signal which includes the CSB signal, the RASB signal, the CASB signal, and the WEB. The signals CSB and RASB are in the low level and the signals CASB WEB are in the high level. The activating command signal is decoded by the input circuit 21 and supplied to the latch circuit 22 having the structure shown in FIG. 5. Since the signal MODE is currently set to the High level, the latch circuit 22 latches the activating command signal delayed by the delay circuit 50 with the extended input hold time in response to the internal clock signal (1).

Also, the external clock signal CLK is externally inputted to the terminal 47 and supplied to the internal clock signal generating circuit 35, as shown in FIG. 9A. The internal clock signal generating circuit 35 generates the internal clock signal (1) 36 from the external clock signal CLK, as shown in FIG. 9D, and the internal clock signal (1) 36 is supplied to the latch circuit 2, 22 and 31, the logic circuit 37 and 43, the write control circuit (WCTRL) 26, the read control circuit (RCTRL) 27, and the delay circuit (D) 39. The logic circuit 37 generates an internal clock signal (2) 38 in response to the internal clock signal (1) 36 as shown in FIG. 9E, and the delay circuit 39 generates internal clock signals (5) 40, (6) 41, and (7) 42 from the internal clock signal (1) 38 and the logic control signals CLT1, CLT2, CLT3 outputted from the state setting circuit 133. Further, the logic circuit 43 generates an internal clock signal (3) 44 from the internal clock signal (1) 36, the internal clock signal (7) 42 which is outputted from the delay circuit 39 and an internal clock permission signal 30 which is outputted from the read control circuit (RCTRL) 27.

In the above synchronous type DRAM, the above-mentioned activating command signal is latched in the latch circuit 22 in response to the internal clock signal (1) 36 and the latched activating command is supplied to the row address control circuit (RA CTRL) 13 which generates, at the time t10, an A bank row address permission signal (to be referred to as an "ARAE" signal) 14 and a B bank row address permission signal (to be referred to as a "BRAE" signal) 15, as shown in FIGS. 9G and 9H.

Also, an address (X) is inputted from the terminal 45 to the input circuit 1 at the time t10 and supplied to the address latch circuit 2 constituted as shown in FIG. 5. Since the signal MODE is currently set to the High level, the address latch circuit 2 latches the address delayed by the delay circuit 50 using the extended input hold time in response to the internal clock signal (1) 36. The latched address (X) is thereafter supplied to the row decoder (RDEC) 8 through the row address buffer (RAB) 7. The row decoder (RDEC) 8 decodes the row address to select one of the row lines as a row selection line 9 at a time t11, as shown in FIG. 9I.

The synchronous type DRAM shown in FIG. 4 has a 2-bank structure as described above. The row address selection and precharge operations can be independently executed to the respective banks by the address selection. The synchronous type DRAM having the 2-bank structure has two control circuits for the row address. As described above, the signal ARAE is the A bank row address permission signal and the signal BRAE is the B bank row address permission signal. When the activating command for each of the banks is inputted, the signal ARAE or BRAE is set to the High level. The signal wave form diagram shown in FIG. 9G is an example when the A bank is selected, and the signal ARAE is set to the High level.

Next, the read and write operation of the synchronous type DRAM will be described with reference to FIGS. 10A to 10J.

Figure 10:
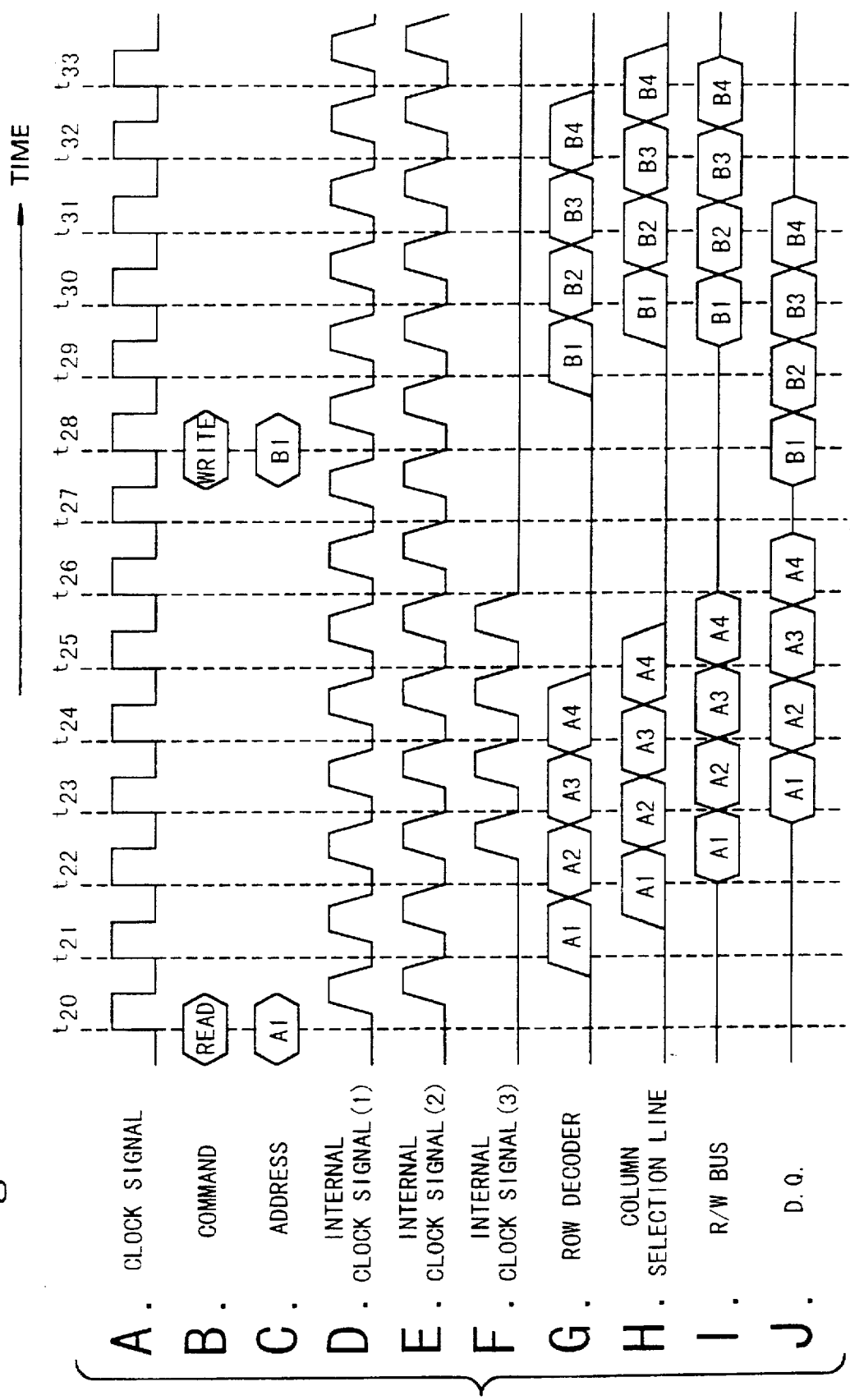
FIGS. 10A to 10J are timing charts illustrating the wave forms of signals when READ and WRITE commands are inputted to the synchronous type DRAM of the present invention shown in FIG. 4.

In FIGS. 10A to 10J, at a time t20, when a READ command (a read operation command: signals CBS and CASB are in the Low level, and signals RASB and WEB are in the High level) is inputted to the terminal 46 as shown in FIG. 10B. An address (A1) is also inputted to the terminal 45 at the time t20 using the extended input hold time, as shown in FIG. 10C. The READ command is decoded by the input circuit 21 and then supplied to the latch circuit 22. Since the signal MODE is currently set to the High level, the command latch circuit 22 constituted as shown in FIG. 5 latches the READ command using the extended input hold time in response to the internal CLK signal (1) 36. The latched READ command signal 25 is inputted to the column address control circuit (CA CTRL) 11 and is also sent to the read control circuit (RCTRL) 27. The column address control circuit (CA CTRL) 11 outputs the column address permission signal 12 to the column address buffer (CAB) 3 in response to the input of the READ command signal 25.

Also, an address (A1) is inputted and supplied to the latch circuit 2 constituted as shown in FIG. 5 through the input circuit 1. Since the signal MODE is currently set to the High level, the address latch circuit 2 latched the address (A1) using the extended input hold time in response to the internal clock signal (1) 36, as shown in FIG. 10C. The latched address (A1) is supplied to the column decoder (CDEC) 4 through the column address buffer (CAB) 3. The address (A1) which is outputted from the column decoder 4 is latched in the latch circuit 5 (a D-type latch circuit) at the time t21 in response to the internal clock signal (2) 38 which is output from the logic circuit 37 and corresponds to the external clock signal at the time t21. As a result, a column selection line 6 corresponding to this address is selected, as shown in FIG. 10H. Thereby, the memory cells for data to be read therefrom can be selected because the row address is outputted from the row decoder 8 at the time t21, as shown in FIG. 10G.

Next, the data which is read out from the memory cell array 10 via the sense amplifier 16 is amplified by the data amplifier 18 and outputted onto the R/W (READ/WRITE) bus 17, as shown in FIG. 10I. The data on the R/W bus 17 is latched by the latch circuit 19 (a D-type flip-flop circuit) at a time t22 in response to the internal clock signal (3) 44 shown in FIG. 10F and corresponding to the external clock signal and is outputted from the terminal 48 through the output circuit 20 at a time t23 as shown in FIG. 10J.

The wave forms shown in FIGS. 10A to 10I are one when a burst length (a length of bits to which the read or write operation is to be continuously executed) is 4 bits. A series of operations are processed in parallel by executing the read operation for a next bit for every cycle. That is, the second bit (A2) is executed at the three clocks of the time t21 to t23, the third bit (A3) is executed at the three clocks of the time t22 to t24 and the fourth bit (A4) is executed at the three clock of the time t23 to t25.

The write operation is almost the same as that of the above-mentioned read operation. At a time t28, a WRITE command (writing operation command, signals CAS, CASB and WEB are in the Low level and signal RASB is in the High level), a write data (DQ), and an address (B1) are inputted to the terminal 46, the terminal 48 and the terminal 45 using the extended input hold time, because the signal MODE is set to the High level, as shown in FIGS. 10B, 10C and 10J.

The WRITE command is decoded through the input circuit 21 and is supplied to the latch circuit 22. The latch circuit 22 latches the WRITE command at the time t28 in response to an internal clock signal (1) 36 which is outputted from the internal clock signal generating circuit 35 which is generated in response to the external clock signal. As a result, a WRITE command signal 24 is output to the write control circuit (WCTRL) 26.

The write data (DQ) inputted from the terminal 48 is inputted to the latch circuit 31 constituted as shown in FIG. 5, through the input circuit 32. Since the signal MODE is currently set to the High level, the write data latch circuit 31 latches the write data using the extended input hold time at the time t28 in response to the internal clock signal (1) 36 which is outputted from the internal clock signal generating circuit 35 which is generated in response to the clock input. The latched write data is inputted to the write control circuit (WCTRL) 26.

Also, on the other hand, the address (B1) is inputted to the latch circuit 2 through the input circuit 1. Since the signal MODE is currently set to the High level, the address latch circuit 2 latches the delayed address signal by the delay circuit 50 using the extended input hold time in response to the internal clock signal (1) 36 which is outputted from the internal clock signal generating circuit 35 which is generated in response to the clock input at the time t28. The latched address (B1) is inputted to the column decoder 4 through the column address buffer 3.

The address (B1) outputted from this column decoder 4 is latched in the latch circuit 5 (the D-type latch circuit) in response to the internal clock signal (2) 38 which is outputted from the logic circuit 37 in response to the external clock signal at the time t29. As a result, a column selection line 6 which corresponds to the address (B1) is selected, as shown in FIG. 10H. Thereby, a memory cell of the memory cell array 10 for data to be written is selected because the row decoder selects one of the row lines as shown in FIG. 10G. At the same time, in response to the internal clock signal (1) 36 which corresponds to the time t29, the write data which has been outputted from the write control circuit 26 is written in the memory cell of the memory cell array 10 via the R/W (READ/WRITE) bus 17 and the sense amplifier 16, as shown in FIG. 10I.

Then, the column selection signal 9 is set to the non-selection state in response to the internal clock signal (2) 38 which is generated in response to the clock input corresponding to the time t30 and then the write operation is ended.

The 4-bit operation is processed in parallel for the write operation, as in the read operation. In other words, the second bit (B2), the third bit (B3) and fourth bit (B4) are executed for the times t29 to t31, the times t30 to t32 and the times t31 to t33 with the 3 clocks, respectively.

The above-mentioned operation mode is referred to as "CAS LATENCY 3" (CAS latency is "3") because data is outputted from the third clock after the READ command is inputted in the read operation, and when the MODE SET command (a command for setting the CAS latency, signals CBS, RASB, CASB and WEB are in the Low level) is inputted, it is set by the state setting circuit 33. Note that although there is an operation mode of another CAS latency, the description is omitted because there is not direct relation with the present invention.

As described above, according to the present invention, the semiconductor memory device includes the state setting circuit and the latches which are controlled by the output signal of the state setting circuit. One of the output signal of the input circuits and a signal obtained by delaying the output signal is selected in each latch circuit by the transfer gate switch. The selected one is latched by the D-type flip-flop circuit. Alternatively, one of the internal clock signal and a signal obtained by delaying the internal clock signal by the delay circuit signal is selected by the transfer gate switch. The output signal of the input circuit is latched in response to the selected one signal. Therefore, one of the input set-up time and the input hold time be set by the state setting command and the address key depending on the state of the system to be used. There is no problem that the input set-up or input hold time determines the product grade even in the high frequency product, and there is the degree of design freedom is twice so that the product design can be made easy.

What is claimed is:

1. A semiconductor memory device comprising:
   an internal clock signal generating section generating an internal clock signal from an external clock signal;
   a latch section including an address latching circuit for latching an inputted address, a command latching circuit for latching an inputted command and a write data latching circuit for latching an inputted write data; and
   a state setting section connected to and controlling said address latching circuit, said command latching circuit and said write data latching circuit, of said latch section, based on an address key latched by said address latching circuit and a mode setting command latched by said command latching circuit such that a time difference is selectively extended between a first timing of said internal clock signal and a second timing for each of an address, a command and a write data to be changed.

2. A semiconductor memory device according to claim 1, wherein said state setting section selectively extends said time difference using at least one bit of the address key.

3. A semiconductor memory device according to claim 2, wherein said state setting section includes at least one flip-flop corresponding to said at least one bit of the address key and generates a mode signal from said at least one bit of the address key in response to said mode setting command to control said address latching circuit, said command latching circuit and said write data latching circuit.

4. A semiconductor memory device according to claim 1, wherein said extended time difference corresponds to an input hold time and an input set-up time is prefixed.

5. A semiconductor memory device according to claim 4, wherein said state setting means generates a mode signal from said address key and said mode setting command to set an input hold time mode, an input set-up time mode being normally set when the input hold time mode is not set, and
   wherein each of said address latching circuit, said command latching circuit and said write data latching circuit comprises:
   a latching circuit latching a latch input in response to said internal clock signal; and
   a delaying circuit normally passing a corresponding one of said address, said command and said write data to said latching means as said latch input in the input set-up time mode and for delaying the corresponding one to supply the delayed corresponding one to said latching means as said latch input in the input hold time mode.

6. A semiconductor memory device according to claim 1, wherein said extended time difference is an input set-up time and an input hold time is prefixed.

7. A semiconductor memory device according to claim 6, wherein said state setting section generates a mode signal from said address key and said mode setting command to set an input set-up time mode, an input hold time mode being normally set when the input set-up time mode is not set, and
   wherein each of said address latching circuit, said command latching circuit and said write data latching circuit comprises:
   a latching circuit latching a corresponding one of said address, said command and said write data in response to a latch clock signal; and
   a delaying circuit normally passing said internal clock signal to said latching circuit as said latch clock signal in the input hold time mode and for delaying said internal clock signal to supply a delayed internal clock signal to said latching circuit as said latch clock signal in the input set-up time mode.

8. A semiconductor memory device according to claim 1, wherein said extended time difference corresponds to an input set-up time and an input hold time.

9. A semiconductor memory device according to claim 6, wherein said state setting section generates a mode signal from said address key and said mode setting command to set an input set-up time mode when the mode signal is non-active and set to an input hold time mode when the mode signal is active, and
   wherein each of said address latching circuit, said command latching circuit and said write data latching circuit comprises:
   a latching circuit latching a latch input in response to a latch clock signal; and
   a delaying circuit passing said internal clock signal to said latching circuit as said latch clock signal in the input hold time mode and delaying a corresponding one of said address, said command and said write data to supply a delayed corresponding one to said latching circuit as said latch input in the input hold time mode, and for normally passing a corresponding one to said latching circuit as said latch input in the input set-up time mode and delaying said internal clock signal to supply a delayed internal clock signal to said latching circuit as said latch clock signal in the input set-up time mode.

10. A method of providing a semiconductor memory device in which a user can select one of use of an input set-up time and use of an input hold time, comprising the steps of:
    generating an internal clock signal from an external clock signal;
    setting an input set-up time mode and an input hold time mode in accordance with a user selection;
    elongating a time difference between a first timing of said internal clock signal and a second timing for each of an address, a command and a write data to be changed, in accordance with a mode set based on an address key and the command; and
    latching said address, said command, and said write data in response to the internal clock signal using an elongated time different for access to a memory cell array of said semiconductor memory device.

11. A method according to claim 10, wherein said setting step includes entering an address key and a command to said semiconductor memory device for a user selection.

12. A method according to claim 10, wherein the user selects the input hold time mode and the input set-up time mode is normally set in said semiconductor memory device.

13. A method according to claim 12, wherein said latching step includes:
    normally passing at least one of said address, said command and said write data as a latch input in the input set-up time mode;

delaying said at least one of said address, command, and write data as said latch input in the input hold time mode; and latching said latch input in response to said internal clock signal.

14. A method according to claim 10, wherein the user selects the input set-up time mode and the input hold time mode is normally set in said semiconductor memory device.

15. A method according to claim 14, wherein said latching step includes:

normally passing said internal clock signal as a latch clock signal in the input hold time mode;

delaying said internal clock signal as said latch clock signal in the input set-up time mode; and latching at least one of an address, a command and a write data in response to said latch clock signal.

16. A method according to claim 10, wherein the user selects one of the input set-up time mode and the input hold time mode which are both selectable in said semiconductor memory device.

17. A method according to claim 16, wherein said latching step includes:

passing said internal clock signal as a latch clock signal in the input hold time mode;

delaying at least one of said address, command and write data as a latch input in the input hold time mode;

passing said at least one of said address, command, and write data as said latch input in the input set-up time mode;

delaying said internal clock signal as said latch clock signal in the input set-up time mode;

latching the latch input in response to the latch clock signal.

* * * * *